United States Patent [19]

Alvarado et al.

[11] Patent Number: 5,773,528

[45] Date of Patent: Jun. 30, 1998

[54] DUAL CURE EPOXY BACKSEAL FORMULATION

[75] Inventors: Julio M. Alvarado, Hopewell Junction; Kathleen L. Covert, Kirkwood, both of N.Y.; Joseph P. Kuczynski, Wellington, Fla.

[73] Assignee: International Business Machines Corporation, Armonk, N.Y.

[21] Appl. No.: 618,545

[22] Filed: Mar. 19, 1996

Related U.S. Application Data

[62] Division of Ser. No. 286,591, Aug. 14, 1994, Pat. No. 5,547,713, which is a continuation of Ser. No. 919,653, Jul. 24, 1992, abandoned, which is a division of Ser. No. 607,435, Oct. 31, 1990, abandoned.

[51] Int. Cl.[6] ............................................. C08F 20/00
[52] U.S. Cl. ........................ 525/438; 525/481; 525/523; 525/533; 522/25; 522/26; 522/27; 522/29
[58] Field of Search .................................. 525/438, 481, 525/523, 533; 522/25, 26, 27, 29

[56] References Cited

U.S. PATENT DOCUMENTS

| | | | |
|---|---|---|---|
| 4,048,356 | 9/1977 | Bakos et al. | 427/379 |
| 4,058,401 | 11/1977 | Crivello | 96/115 |
| 4,173,551 | 11/1979 | Crivello | 260/18 |
| 4,225,691 | 9/1980 | Crivello | 526/192 |
| 4,256,828 | 3/1981 | Smith | 430/280 |
| 4,287,228 | 9/1981 | Schlesinger | 427/54.1 |
| 4,289,595 | 9/1981 | Tortorello | 528/91 |
| 4,308,118 | 12/1981 | Dudgeon | 204/159.11 |
| 4,318,766 | 3/1982 | Smith | 156/330 |
| 4,351,708 | 9/1982 | Berner et al. | 204/159.23 |
| 4,374,751 | 2/1983 | Dudgeon | 252/426 |
| 4,378,277 | 3/1983 | Smith | 204/159.18 |
| 4,398,013 | 8/1983 | Johnson | 528/89 |
| 4,404,355 | 9/1983 | Eldin et al. | 528/89 |
| 4,412,048 | 10/1983 | Dixon et al. | 525/524 |
| 4,479,990 | 10/1984 | Dixon et al. | 428/36 |
| 4,703,338 | 10/1987 | Sagami et al. | 357/72 |
| 4,818,776 | 4/1989 | Koleske | 522/31 |
| 4,842,800 | 6/1989 | Walles et al. | 264/272.13 |
| 4,857,562 | 8/1989 | Wacker et al. | 522/31 |
| 4,966,922 | 10/1990 | Gross et al. | 522/25 |

FOREIGN PATENT DOCUMENTS 3-139515  6/1991  Japan.

*Primary Examiner*—Randy Gulakowski
*Attorney, Agent, or Firm*—Heslin & Rothenberg, P.C.

[57] ABSTRACT

A photocopolymerizable composition for backsealing a ceramic carrier and process for using the composition is disclosed. The composition comprises: a liquid, multifunctional, bisphenol based epoxy; a liquid, multifunctional hydroxyl containing organic material; a complex onium salt photoinitiator; and, a complex cupric salt initiator. The composition utilizes a strong Bronstead acid for additional deep curing created by iodonium salt thermolysis.

5 Claims, 3 Drawing Sheets

IODONIUM SALT THERMOLYSIS:

$$R\text{-}OH + 2\,Cu(II)L_2 \xrightarrow{\Delta} R=O + 2\,Cu(I)L + 2\,HL$$

$$Ar_2I^+ X^- + Cu(I)L \longrightarrow ArI + \langle Ar\text{-}Cu(III)LX \rangle$$

$$\langle Ar\text{-}Cu(III)LX \rangle + M \longrightarrow Ar\text{-}M^+ X^- + Cu(I)L$$

$$Ar\text{-}M^+ X^- + nM \longrightarrow Ar\text{-}(M)\overline{_n}M^+ X^-$$

$$\langle Ar\text{-}Cu(III)LX \rangle + R'\text{-}OH \longrightarrow Ar\text{-}OR' + Cu(I)L + H^+ X^-$$

$$H^+ X^- + M \longrightarrow H\text{-}M^+ X^- \xrightarrow{nM} H\text{-}(M)\overline{_n}M^+ X^-$$

R - OH = SECONDARY EOPXY HYDROXYL OR ADDED REACTANT
L = BENZOATE, ACETATE $$Ar = -\langle\bigcirc\rangle\,,\ +\langle\bigcirc\rangle$$

$X = SbF_6$

M = EPOXY MONOMER

- POLYMERIZATION TERMINATED BY RXN WITH X -
- LATENT THERMAL INITIATOR, Cu(I)L
  - STABLE AT R.T.
- GENERATION OF STRONG BRONSTED ACID, H+

*FIG. 2*

DUAL CURE EPOXY BACKSEAL FORMULATION

CROSS REFERENCE TO RELATED APPLICATIONS

This application is a division of earlier copending application, Ser. No. 08/286,591 filed Aug. 14, 1994, now U.S. Pat. No. 5,547,713 which was a continuation of application Ser. No. 07/919,653 filed Jul. 24, 1992, now abandoned, which was a division of application Ser. No. 07/607,435, filed Oct. 31, 1990, now abandoned.

FIELD OF INVENTION

This invention relates generally to epoxy coating compositions. More particularly, it relates to a fast bisphenol based, photocurable epoxy, which additionally uses a thermally produced, strong Bronstead acid for thermal curing.

BACKGROUND OF THE INVENTION

During the fabrication of electronic packages, an integrated circuit chip is mounted on to a ceramic carrier, a metallic cap crimped onto the ceramic carrier over the chip and ceramic carrier is soldered to a printed circuit board. The metallic cap protects the circuitry on the integrated circuit chip and the ceramic carrier. However, crimping the cap does not provide a complete seal, and it is necessary to utilize another means of protecting the chip from subsequent processing, where harsh cleaning solvent chemicals are used, as well as from moisture in the environment. This can be accomplished by sealing the "back" of the ceramic carrier, the surface which is soldered to the printed circuit board, with a silicone or epoxy based coating composition. Several requirements exist for the coating material used in the backseal process. The material must have a low coefficient of thermal expansion (CTE), to match the CTE of the ceramic substrate. It must have excellent solvent resistance to withstand the chemicals in later processing. The composition should be 100% reactive, i.e., no volatile solvents are present after the curing process. The coating material must also be physically and thermally durable to survive the bubble leak and wave solder tests used to eliminate defective modules prior to card assembly. Finally, the formulation must be relatively inexpensive, as large volumes of the material are required for the backseal process.

In the past, an anhydride cured, bisphenol A (4,4'-isopropylidenediphenol) based epoxy, a proprietary product by 3M named Scotchcast, (Scotchcast is a registered trademark of Minnesota Mining and Manufacturing Company) was employed as the backseal material. However, several disadvantages exist with Scotchcast: primarily, a limited pot life and lengthy cure schedules, but also, problems with incomplete reaction of the anhydride. Scotchcast is a two-part system consisting of an epoxy and an anhydride hardener in a polyether polyester flexibilizer medium. Once the two parts are mixed, the mixture must be refrigerated due to the room temperature reactivity of the anhydride. Even with refrigeration, the pot life of the mixture is approximately five hours at 40° C., less than a typical eight hour shift on the semiconductor line. In addition, curing times in excess of eight hours are routine. The anhydride used in Scotchcast is cis-hexahydrophtalicanhydride (HHPA) which is solid at room temperature, and therefore, HHPA has a tendency to crystallize out of the mixed material. Furthermore, HHPA is hydroscopic, resulting in the generation of free acid which can catalyze an etherfication reaction. The optimum HHPA concentration of 75–85 parts per 100 resin (phr) approaches a one to one stoichiometry which depresses the overall end use material properties obtainable with the epoxy material. Decreased solvent resistance and decreased thermal stability occur at the 1:1 stoichiometry. Lower concentrations of the anhydride decrease the heat distortion temperature, increase weight loss and impart poor solvent resistance. High concentrations of the HHPA promote the etherfication, resulting in residual unreacted anhydride. The slow curing reaction typically requires extended bakes at temperatures high enough to insure the adequate thermal and physical resistance through subsequent processing. If the HHPA is either unreacted or has crystallized out, the anhydride can break down thermally during the curing process or wave solder tests into volatile solvents. The volatile solvents evaporate, and thereby cause pin holes or cracking in the backseal. The pin holes or cracking destroy the integrity of the module, and allow cleaning solvents or moisture access to the chip circuitry.

Because of the deficiencies of the Scotchcast material for the backseal process, an effort began to replace the material. For the new material, it would be desirable to have a coating composition, which in addition to meeting the requirements above, also is a one part, room temperature stable epoxy system possessing a much more rapid curing process to reduce cycle time. Ideally, the one-part epoxy system would have an indefinite pot life. Further, in view of the problems associated with the HHPA anhydride, it would be advantageous if the new material utilized a different curing method.

The requirement for a one-part epoxy coating composition can be met by the use of a photocopolymerizable composition. It is well known that mixtures of epoxies and hydroxyl containing materials can be radiation cured by the use of onium salts. The onium salts form stable formulations with epoxies and hydroxyl containing materials in an environment free of ultraviolet light radiation. When onium salts are radiated with ultraviolet light, a cationic catalyst composition is formed which cures the mixture. It is also known that the particular hydroxyl containing material selected as an ingredient in the radiation curable epoxy affects the cure rate and the properties of the cured material.

While there are prior art photocurable epoxy systems which are one part, room temperature stable compositions possessing a more rapid curing cycle than the Scotchcast material, they lack the physical properties which make Scotchcast attractive. After exhaustive experimentation, none of these existing photocurable epoxies tested possessed the required properties of a backseal material: low CTE, excellent solvent resistance and physical and thermal durability. Further, a problem with the use of a purely photocurable composition is that not all of the backseal material is accessible by light, particularly the material behind the crimp in the cap. Therefore, a purely photocurable composition would pose unacceptable risks to leave uncured epoxy in the cap.

SUMMARY OF THE INVENTION

It is therefore an object of the present invention to backseal a ceramic carrier with a photocurable epoxy, which uses a quick, latent thermal cure where light cannot reach.

It is a further object of the present invention that the photocurable epoxy composition possess the necessary physical characteristics for a backseal material: low coefficient of thermal expansion, excellent solvent resistance, and physical and thermal durability.

It is another object of the present invention that the photocurable epoxy composition be stable at room temperature and have a rapid curing cycle.

These and other objects are accomplished by a photocopolymerizable epoxy composition which comprises: (A) a liquid, multifunctional, bisphenol A based epoxy; (B) a liquid, multifunctional, hydroxyl containing organic material; (C) a complex salt photoinitiator selected from the class of onium salts, from the group of iodonium or sulfonium salts and; (D) a complex cupric salt initiator.

Both the bisphenol A based epoxy and the hydroxyl containing organic material must be liquid at room temperature to avoid the precipitation problem associated with the HHPA in the prior art method. Further, both must be multifunctional, that is, the bisphenol-based epoxy must have two or more epoxy groups per molecule and the hydroxyl containing organic material must have two or more hydroxyl groups per molecule. To achieve the desired physical and thermal properties, the epoxy:hydroxyl ratio must be strictly maintained between 4:1 to 9:1. The hydroxyl containing organic material can also function as a flexibilizer. Suitable hydroxyl containing compounds are polyether polyols or polyester polyols.

The properties of the onium salts should be good thermal stability in the presence of epoxies and adequate spectral overlap for absorption of light with the mercury lamp output.

The composition can also further comprise a dye or pigment to add a desired color to the cured composition. The use of a dye rather than a pigment is preferred because the morphology of any filler is important. Another optional component of the composition is a filler. They can be used to reduce the cost of the formulation. The use of small spherical fillers which do not alter the viscosity of the formulation to any great extent is preferred.

BRIEF DESCRIPTION OF THE DRAWINGS

FIG. 1a is a cross section representation of a ceramic module suitable to be backsealed by the method of the present invention.

FIG. 1b is a cross section of a portion of the ceramic module of FIG. 1a.

FIG. 2 represents the chemical mechanism for iodonium salt thermolysis.

DETAILED DESCRIPTION OF THE INVENTION

Figures 1A, 1B:
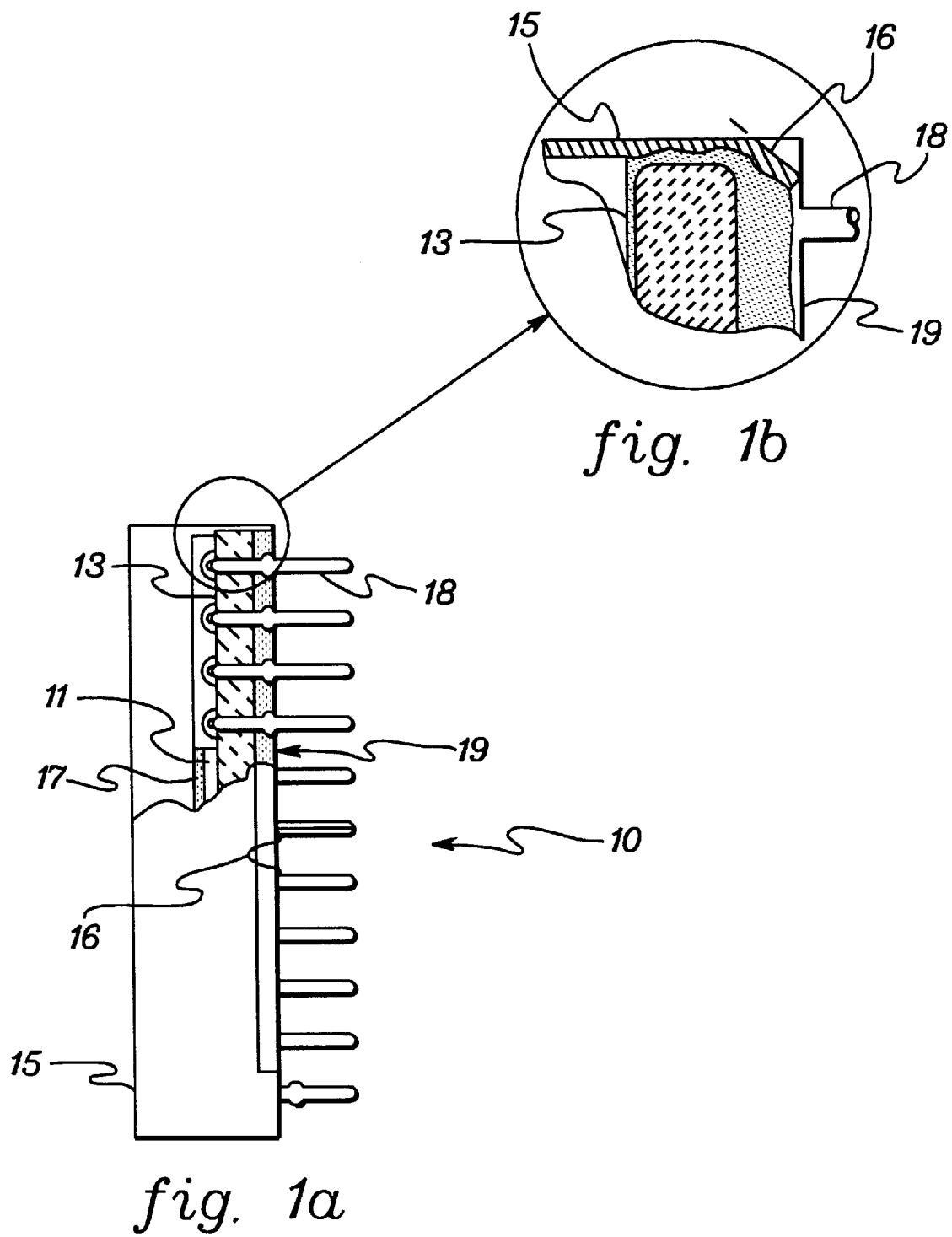

Referring to FIGS. 1a and 1b, a perspective view of a completed ceramic module assembly 10 is shown. Semiconductor chip 11 is electrically connected to the top of the ceramic substrate 13 by means of small solder balls. The solder balls are attached to pads on both the chips 11 and substrate 13. For more information on the joining process between the semiconductor chips and the ceramic substrate, refer to commonly assigned U.S. Pat. No. 4,360,142 entitled "Method Of Forming A Solder Interconnection Capable Of Sustained High Power Levels Between A Semiconductor Device And A Supporting Substrate" by Carpenter et al., which is incorporated herein by reference. The protective cap 15 is crimped by a series of metal crimps 16 to the periphery of the substrate 13. The substrate 13 and cap 15 depicted in FIGS. 1a and 1b measure 28 mm by 28 mm however, the present invention can be readily adapted to smaller and larger modules. To promote heat transfer away from the chip 11, a thermal paste 17 can be used to provide a thermal bridge between the chip 11 and the cap 15.

Connector pins 18, numbering approximately a hundred or more, are fixed to the "back" of the ceramic to provide electric contact from the ceramic substrate 13 to a circuit board (not shown). The backseal material 19 is applied to the back of the ceramic substrate 13 and around its periphery. It is desirable to have a small, but controlled amount of the material 19 "run-in" between the substrate 13 and cap 15 to provide a better seal. The present invention will perform equally well with a substrate composed of a conventional ceramic material or the newer glass-ceramic materials to which the semiconductor industry is evolving. In the nomenclature of the present application, the term, "ceramic" is used to be inclusive of both these types of substrates.

Using the prior art anhydride cured material, the following process steps were followed to backseal the completed module shown in FIG. 1: First, the HHPA was preheated for 4–6 hours at 42° C. to melt the HHPA in preparation for mixing with the epoxy. The manufacturer has recently recommended that this preheat be extended to 20 hours at 65° C. to prevent anhydride recrystallization. Next, the HHPA and bisphenol A epoxy are mixed together. The epoxy mixture is allowed to outgas for 10 minutes at room temperature to remove entrapped air during mixing of part A and B. If the material is not outgassed, air bubbles will be cured within the epoxy which may present a reliability concern. The completed module is then preheated to outgas entrapped air between the ceramic substrate 13 and the cap 15. This preheating step is necessary to remove entrapped air between and to promote "run-in" of the epoxy between the substrate 13 and cap 15 at the periphery of the module. As the module is preheated, the epoxy mixture is also heated to reduce the viscosity of the mixture to facilitate flow through the dispense nozzle. The module is positioned on the cap 15 so that the connector pins 18 face upwards. The epoxy mixture is dispensed on the exposed back of the module, preferably by an automated tool which controls the shot size of the epoxy for each module. Finally, the modules are thermally cured for eight or more hours. The modules are cured for the first four hours at 100° C. and the second four hours at 150° C.

The prior art method described above requires lengthy preheating of materials, in addition to an eight hour cure cycle. Despite the extra care and time taken in the backseal process, the problems recited in the background section above are often encountered. Due to these problems, the search for an alternate backseal material was initiated.

Photolytic generation of Bronstead acids from onium salts is well known in the prior art, particularly in photolithographic applications. Because of the nature of the backseal process, a latent thermal cure of the epoxy composition must also be provided. Thermally induced acid production from iodonium salts has also been known since the late 1970's, but has not been fully exploited. The proposed mechanism for iodonium salt thermolysis is depicted in FIG. 2. A cupric salt is thermally reduced to Cu(I) in the presence of a hydroxyl containing organic material. The hydroxyl containing organic material may be either secondary hydroxyls from the base catalyzed phenol-epoxide condensation reaction of commercially available epoxy resins, or an intentionally added reactant. The Cu(I) then undergoes a redox reaction with the diaryliodonium salt reducing it to an aryl iodide and generating a short lived, organocopper intermediate, [ArCu(III)LX]. In the presence of nucleophilic monomers, the organocopper intermediate behaves as an electrophile and arylation occurs resulting in the initiation of cationic polymerization. When hydroxyl containing species are present, the organocopper intermediate reacts to produce strong acids (HX) and the Cu(I) salt. The acid readily promotes cationic polymerization and the Cu(I) salt serves as a catalyst. Polymerization is terminated by reaction with X⁻ selected from the non-nucleophilic complex metal halide counterions: $SbF_6^-$, $AsF_6^-$, $PF_6^-$ and $BF_4^-$. As shown in FIG. 2, the Cu(II)/iodonium salt pair function as a room temperature stable, latent thermal initiator for epoxide polymerization.

The chemistry discussed above indicates the Cu(II)/iodonium salt pair can function as a compatible thermal catalyst to the onium salt photoinitiator.

Based upon the above discussion, a preferred backseal formulation comprised of a liquid, bisphenol A based multifunctional epoxy, a polyether or polyester polyol and an iodonium salt/cupric salt initiator system was devised.

Bisphenol A based epoxy resins can be described by the chemical structure:

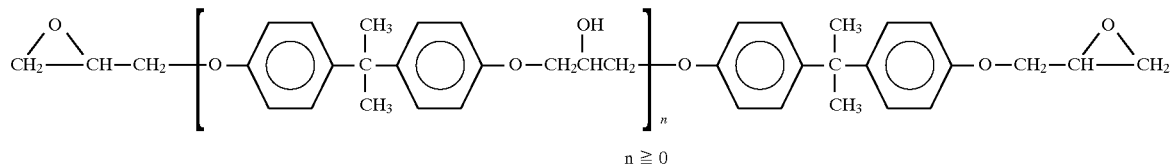

$n \geq 0$

Suitable commercially available liquid, multifunctional bisphenol based epoxy resins include Ciba-Geigy Aratronic 5040, Aratronic 50-46, Aratronic 3001 and Araldite 6010. Other commercially available bisphenol A based epoxy resins are DOW Quatrex 1010, DOW DER 331 and Shell Chemical Epon 828.

Polyether polyols are the group of compounds which have the following structure:

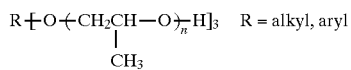

Suitable polyether polyols or polyester polyols must be liquid at room temperature and possess a viscosity of 800–1500 centipoise at room temperature. Commercially available polyether or polyester polyol compounds include Union Carbide Niax LHT 28. Niax, LHT 34, Niax LHT 42, Niax L6-650, Niax PPB-4022 and DOW VORANDOL 2070.

The function of a hydroxyl containing derivative as a flexibilizer is referenced in the literature. In general, they function as chain transfer agents:

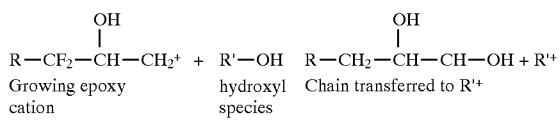

Here, a greater number of smaller "chains" are produced as opposed to a lesser number of larger chains-resulting in a more flexible network.

A sulfonium salt is described by the chemical formula:

$Ar_3S^+X^-$

Ar=Aryl, alkyl, substituted aryl/alkyl
X=$BF_4$, $PF_6$, $AsF_6$, $SbF_6$, $CF_3SO_3$
An iodonium salt is described by the chemical formula:

$Ar_2I^+X^-$

Ar=Aryl, alkyl, substituted aryl/alkyl
X=$BF_4$, $PF_6$, $AsF_6$, $SbF_6$, $CF_3SO_3$ The properties of the onium salts should be good thermal stability in the presence of epoxies and adequate spectral overlap for absorption of light with the mercury lamp output. Both properties are generally met with aryl groups on the onium salts. In general, the iodonium salt can function both as the photoinitiator and thermal initiator; the sulfonium salt functions only as a photoinitiator. In the formulation of the best mode, both onium salts are preferred since the iodonium salt has much poorer overlap with the mercury lamp.

Suitable examples of the aromatic iodonium complex salt photoinitiators include:
diphenyliodonium tetrafluoroborate
di(4-methylphenyl)iodonium tetrafluoroborate
phenyl-4-methylphenyliodonium tetrafluoroborate
di(4-heptylphenyl)iodonium tetrafluoroborate
di(3-nitrophenyl)iodonium hexafluorophosphate
di(4-chlorophenyl)iodonium hexafluorophosphate
di(naphthyl)iodonium tetrafluoroborate
di(4-trifluoromethylphenyl)iodonium tetrafluoroborate
diphenyliodonium hexafluorophosphate
di(4-methylphenyl)iodonium hexafluorophosphate
diphenyliodonium hexafluoroarsenate
di(4-phenoxyphenyl)iodonium tetrafluoroborate
phenyl-2-thienyliodonium hexafluorophosphate
3,5-dimethylpyrazolyl-4-phenyliodonium hexafluorophosphate
diphenyliodonium hexafluoroantimonate
2,2'-diphenyliodonium tetrafluorobrate
di(2,4-dichlorophenyl)iodonium hexafluorophosphate
di(4-bromophenyl)iodonium hexafluorophosphate
di(methoxyphenyl)iodonium hexafluorophosphate
di(3-carboxyphenyl)iodonium hexafluorophosphate
di(3-methoxycarbonylphenyl)iodonium hexafluorophosphate
di(4-acetamidophenyl)iodonium hexafluorophosphate
di(2-benzothienyl)iodonium hexafluorophosphate
Of the aromatic iodonium complex salts which are suitable for use in the compositions of the invention the preferred salts are the diaryliodonium hexafluorophosphate and the diaryliodonium hexafluoroantimonate. These salts are preferred because, in general, they are more thermally stable, promote faster reaction, and are more soluble in inert organic solvents than are other aromatic iododium salts of complex ions.

Examples of suitable aromatic sulfonium complex salt photoinitiators include:
triphenylsulfonium tetrafluoroborate
methyldiphenylsulfonium tetrafluoroborate
dimethylphenylsulfonium hexafluorophosphate
triphenylsulfonium hexafluorophosphate
triphenylsulfonium hexafluoroantimonate
tritolysulfonium hexafluorophosphate
anisyldiphenylsulfonium hexafluoroantimonate
4-butoxyphenyldiphenylsulfonium tetrafluoroborate 4-chlorophenyldiphenylsulfonium hexafluoroantimonate
tris(4-phenyoxyphenyl)sulfonium hexafluorophosphate
di(4-ethoxyphenyl)methoylsulfonium hexafluoroarsenate
4-acetoxy-phenyldiphenylsulfonium tetrafluoroborate
tris(4-thiomethoxyphenyl)sulfonium hexafluorophosphate
di(methoxysulfonylphenyl)methylsulfonium hexafluoroantimonate,
di(carbomethoxyphenyl)methylsulfonium hexafluorophospate
4-acetamidophenyldiphenylsulfonium tetrafluoroborate
dimethylnaphythylsulfonium hexafluorophasphate
trifluoromethyldiphenylsulfonium tetrafluoroborate
methyl(N-methylphenothiazinyl)sulfonium hexafluoroantimonate,
phenylmethylbenzylsulfonium hexafluorophospate
10-methylphenoxathiinium hexafluorophosphate
5-methylthianthrenium hexafluorophosphate
10-phenylthioxanthenium hexafluorophosphate
10-phenyl-9,9-dimethylthioxanthenium hexafluorophosphate
10-phenyl-9-oxothioxanthenium tetrafluoroborate
5-methyl-10-oxothianthrenium tetrafluoroborate
5-methyl-10,10-dioxothianthrenium hexafluorophosphate Of the aromatic sulfonium complex salts which are suitable for use in the compositions of the invention, the preferred salts are the triaryl-substituted salts such as triphenylsulfonium hexafluorophosphate. The triaryl-substituted salts are preferred because they are more thermally stable than the mono- and diaryl substituted salts thereby providing a one-part curable system with long shelf life. Also, the reaction of photocuring at a given light exposure is greater when triaryl-substituted complex salts are used. Thus, in the preferred embodiment, the complex onium salt photoinitiator will comprise a mixture of a diaryl iodonium salt and triaryl sulfonium salt.

At least an effective amount of the cupric salt will be used, which can be experimentally determined with ease by those of ordinary skill in this art. Preferably, it will be approximately equal to the weight of said iodonium salt catalyst.

The cupric salt initiator is identified by the chemical formula:

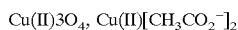

as specific examples

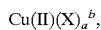

where

X is either organic or inorganic and the product a·b=−2

The copper salts will be any of a copper halide, e.g., bromide, chloride, or copper stearate, copper gluconate, copper citrate, copper naphthenate, copper benzoate and copper acetate monohydrate.

The primary requirements for the backseal material were: 1) a one part, room temperature stable (indefinite pot life) system; 2) rapid curing and reduced cycle time and ; 3) survival of physical and thermal testing including bubble leak, thermal shock, thermal cycle and reversion.

With these restrictions in mind, the following materials were selected:

Dow Quatrex 1010 epoxy resin (bisphenol A based, moderate viscosity liquid, multifunctional epoxide)

Union Carbide Niax LHT 28 polyetherpolyol (flexibilizer and chain transfer agent, optimum viscosity for dispensing composition)

General Electric UVE 1014 (photoinitiator; 50% solids solution of a mixed triaryl sulfonium salts in propylene carbonate)

Ciba Geigy Orasol Red G (a thermally stable dye)

Diphenyliodonium hexafluoroantimonate (photoinitiator/thermal initiator; as a 50% solids soln. in propylene carbonate)

Cupric acetate (anhydrous catalyst for onium salt degradation to H+; as a 0.1M soln in THF)

Dow Quatrex 1010 is a bisphenol A based, multifunctional, liquid epoxy with an intrinsic viscosity of 11,000 to 14,000 centipoise (cP) at 25° C., weight per epoxy of 182–190, a low hydrolyzable chloride level of 100 ppm and a fairly monodisperse molecular weight distribution. Union Carbide Niax LHT 28 is a polypropylene oxide based polyether triol with a viscosity of 1,100 cP at 25 C. and a hydroxyl # of 28 mg KOH/g. LHT 28 serves as a source of secondary hydroxyl groups and as a chain transfer agent.

In actual practice, a stock solution of the Orasol dye, General Electric UVE 1014, the iodonium salt and cupric acetate is prepared in advance and added to the mixture of the LHT 28 and Quatrex 1010 resins. The composition is homogenized by means of a high shear mixer.

EXAMPLE 1

An epoxy of the following formulation was prepared by thorough mixing:

| | |
|---|---|
| Quatrex 1010 | 83.6 wt % |
| Niax LHT-28 | 13.0 wt % |
| GE UVE 1014 | 1.7 wt % |
| Diphenyliodonium-SbF$_6$ | 0.85 wt % |
| Cupric acetate | 0.85 wt % |
| Orasol Red G | 0.0067 wt % |

Unlike the prior backseal process, no preheat of any component is required prior to mixing.

2.0 grams of the above formulation was dispensed onto a pre-heated module, passed through a Fusion conveyorized UV cure unit at 12 feet per minute (fpm) then baked 150° C. for 15 minutes. The coating was cured to a hard finish which survived thermal shock testing through solder shock.

EXAMPLES 2–4

The following epoxy compositions were prepared by thorough mixing:

| | 2. | 3. | 4. |
|---|---|---|---|
| Quatrex 1010 | 91.6 wt % | 71.6 wt % | 46.6 wt % |
| Niax LHT-28 | 5.0 wt % | 25.0 wt % | 50.0 wt % |
| CE UVE 1014 | 1.7 wt % | 1.7 wt % | 1.7 wt % |
| Diphenyliodonium-SbF$_6$ | 0.85 wt % | 0.85 wt % | 0.85 wt % |
| Cupric acetate | 0.85 wt % | 0.85 wt % | 0.85 wt % |

Examples 2–4 cured as in example 1 exhibited solder shock induced stress cracking (example 2) or failed bubble leak testing (examples 3–4). These examples illustrate sensitivity of formulation to the proper epoxy:hydroxyl ratio.

The following epoxy compositions were mixed thoroughly by shear mixing.

EXAMPLE 5

| | |
|---|---|
| Quatrex 1010 | 83.6 wt % |
| Niax LHT-28 | 13.0 wt % |
| GE UVE 1014 | 1.7 wt % |
| Di-t-butylphenylibdonium-SbF$_6$ | 0.85 wt % |

-continued

| | |
|---|---|
| Cupric Acetate | 0.85 wt % |
| Orasol Red G | 0.0067 wt % |

EXAMPLE 6

| | |
|---|---|
| Quatrex 1010 | 83.6 wt % |
| Niax LHT-28 | 13.0 wt % |
| GE UVE 1014 | 1.7 wt % |
| GE XS1350C | 0.85 wt % |
| Cupric Acetate | 0.85 wt % |
| Orasol Red G | 0.0067 wt % |

Examples 5–6 cured as in example 1. All samples passed bubble leak and solder shock testing. The General Electric XS1350C is a 45% solution of bis(dodecylphenyl)iodonium hexafluoroantimonate in 2-ethyl -1,3 hexanediol.

EXAMPLE 7

The following epoxy was prepared by thorough mixing.

| | |
|---|---|
| Quatrex 1010 | 83.6 wt % |
| Niax LHT-28 | 13.0 wt % |
| Sulfonium salt | 1.7 wt % |
| Diphenyliodonium-SbF$_6$ | 0.85% |
| Cupric acetate | 0.85% |
| Orasol Red G | 0.0067 wt % |

In example 7, the formulation is the same as in example 1, except that the GE UVE 1014 was replaced with 1.7 wt % of another sulfonium salt:
Samples cured as in example 1 passed bubble leak and solder shock testing.

EXAMPLE 8

This composition was thoroughly mixed by shear mixing.

| | |
|---|---|
| Quatrex 1010 | 83.6 wt % |
| Niax LHT-28 | 13.0 wt % |
| GE UVE1014 | 1.7 wt % |
| Diphenyliodonium-SbF$_6$ | 0.85% |
| Cupric acetate | 0.85% |
| Orasol Red G | 0.01 wt % |

The formulation is similar to example 1 except that the Orasol Red G concentration was increased to 0.01 wt %. Samples cured as in example 1 resulted in non-cured surface exhibiting non-uniform depth of cure.
The following compositions were thoroughly mixed and processed as in example 1.

EXAMPLE 9

| | |
|---|---|
| Quatrex 1010 | 83.6 wt % |
| Niax LHT-34 | 13.0 wt % |
| GE UVE 1014 | 1.7 wt % |
| Diphenyliodonium-SbF$_6$ | 0.85 wt % |
| Cupric acetate | 0.85 wt % |
| Orasol Red G | 0.0067 wt % |

EXAMPLE 10

| | |
|---|---|
| Quatrex 1010 | 83.6 wt % |
| Niax LHT-42 | 13.0 wt % |
| GE UVE 1014 | 1.7 wt % |
| Diphenyliodonium-SbF$_6$ | 0.85 wt % |
| Cupric acetate | 0.85 wt % |
| Orasol Red G | 0.0067 wt % |

The formulations are similar to example 1, except that LHT-28 was replaced with LHT-34 (example 9) or LHT-42 (example 10). Samples were cured as in example 1 and passed bubble leak and solder shock testing. LHT-28 is the preferred polyether polyol due to its high viscosity, which provides for a better dispense properties onto the ceramic substrate.

EXAMPLES 11–12

| | 11. | 12. |
|---|---|---|
| Quatrex 1010 | 85.3 wt % | 83.3 wt % |
| Niax LHT-28 | 13.0 wt % | 13.0 wt % |
| GE UVE 1014 | 0.0 wt % | 2.0 wt % |
| Diphenyliodonium-SbF$_6$ | 0.85 wt % | 0.85 wt % |
| Cupric acetate | 0.85 wt % | 0.85 wt % |

Examples 11 and 12 cured as in example 1 resulted in either incompletely cured material (example 11) or surface polymerization only (example 12).

EXAMPLE 13

The following composition was prepared by thorough mixing.

| | |
|---|---|
| Quantrex 1010 | 58.71 wt % |
| Niax LHT 28 | 19.27 wt % |
| GE X51350C | 1.17 wt % |
| Cupric acetate | 1.295 wt % |
| Noyakup L207AGG1 | 19.55 wt % |

Following mixing, the 2.0 g of the composition was dispensed into a preheated module, exposed to UV light through a Fusion converyorized UV cure unit and baked at 150° C. for 30 minutes. All samples used Novakup L207AGG1, a silica filler, to reduce the cost of the epoxy composition. Silica fillers have the added advantage of a low CTE which closely matches the CTE of the ceramic substrate.
Based on the preceding examples, the precise formulation of the best mode is shown below:

| | |
|---|---|
| Dow Quatrex 1010 | 83.43% |
| Niax LHT 28 | 13.23% |
| GE UVE 1014 | 1.66% |
| Iodonium salt | 0.834% |
| Cupric acetate | 0.834% |
| Orasol Red G | 0.00667% |

With respect to material properties of the formulation that make it uniquely suited for the backseal operation, this material is tailored to possess a low coefficient of thermal expansion, excellent solvent resistance, indefinite pot life, deep through-cure and rapid curing kinetics. All other prior art is deficient in one or more of these properties.

Limits on the percentages of the constituents cited above in the best mode are necessary to maintain adequate physical properties. Compositions outside the bounded percentages result in inferior backseal materials and/or lengthy cure schedules. For the materials listed above, the acceptable ranges are tabulated below:

| Constituent | Range, Wt % |
|---|---|
| Quatrex 1010 | 77.3–87.0 |
| Niax LHT 28 | 9.7–19.3 |
| GE UVE 1014 | 1.25–1.70 |
| Iodonium salt | 0.50–1.00 |
| Cupric Acetate | 0.50–1.00 |
| Orasol Red G | 0.00–.008 |

At concentrations in excess of 87% Quatrex 1010 (or concentrations below 9.7% LHT 28), stress cracking results upon thermal curing of the formulation. At concentrations below the lower limit of Quatrex 1010, (or above the upper limit of LHT 28), a longer post bake is required. Optimal photocure is obtained only with compositions formulated within the range listed for GE UVE 1014 and Orasol Red G. Higher percentages of either constituent results in surface polymerization only; lower concentrations yield incompletely cured material. Regarding the iodonium salt and cupric acetate concentrations, formulations comprised of either compound above the upper limit impart excessive ionic content whereas formulations containing either constituent below the lower limit demand excessive process time.

The following summarizes the process for which the new material was formulated. A ceramic module (with IC and heat sink attached) is pre-heated to outgas entrapped air between the ceramic and the heatsink. The backseal material is dispensed directly onto the heated module which is then passed through a conveyorized UV curing unit (residence time less than or equal to 60 seconds). A post bake at 150° C. for less than or equal to 30 minutes completes the cure.

Figure 3:
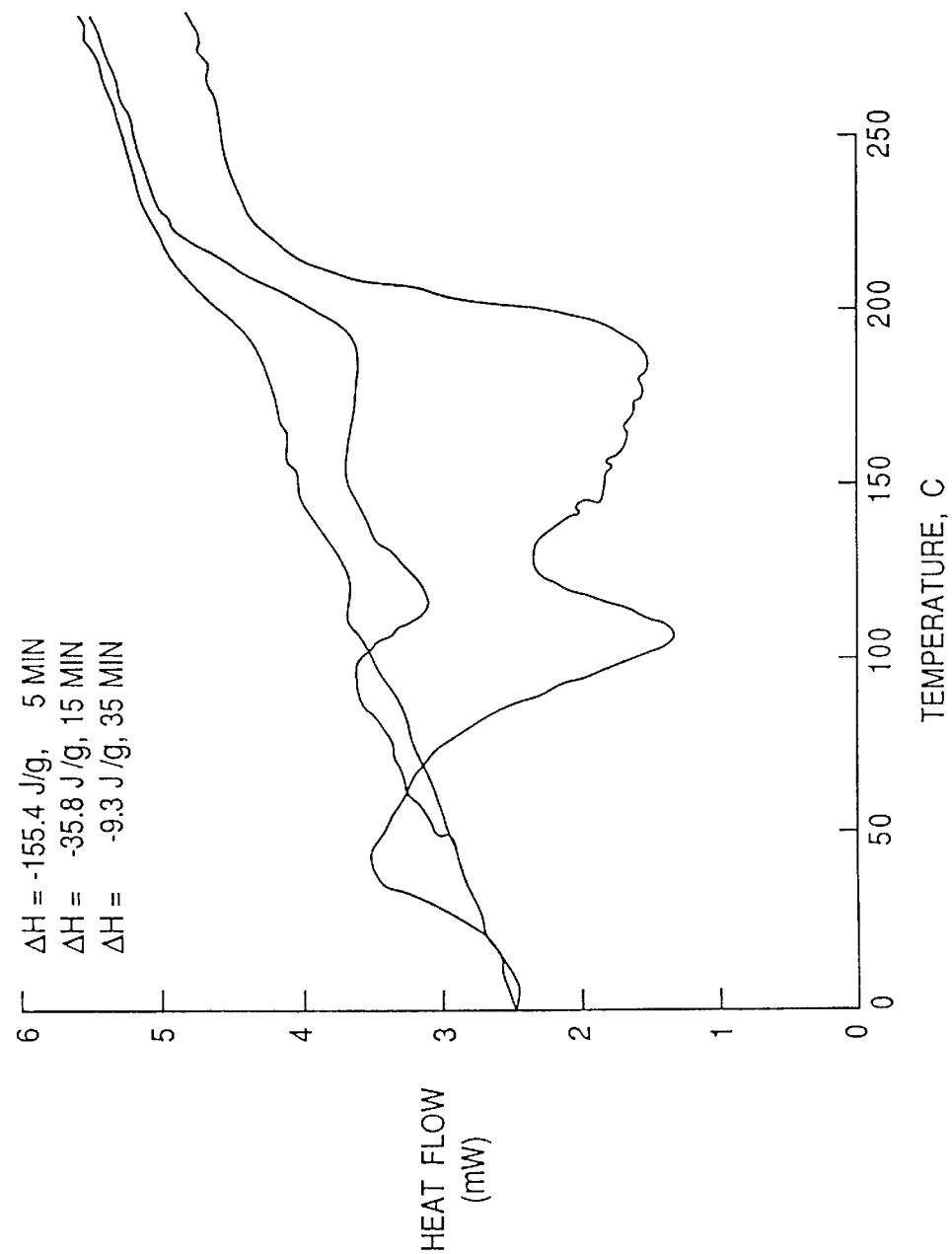
FIG. 3 is a series of residual exotherms which show how quickly the composition of the preferred embodiment of the present invention will cure after photoexpose at 150° C.

Representative curing kinetics are illustrated in FIG. 3 as residual exotherms following isothermal cure at 150° C. for various times. As the thermograms indicate, the amount of residual, unreacted epoxy dramatically decreases as a function of time at 150° C. After only 30 minutes cure, greater than 95% conversion occurs. The data also show an increase in the Tg (temperature at onset of exotherm) from 45° C. to 127° C. as the time at 150° C. increases. In comparison, Scotchcast exhibits a Tg of 80° C. and requires 4 hours at 100° C. followed by 4 hours at 145° C. for complete conversion. A 16× reduction in process cycle time results using the fast backseal formulation.

While the invention has been described with respect to several illustrative examples, it would be understood by those skilled in the art that modifications maybe made without parting from the spirit and scope of the present invention. The embodiments presented above are for purposes of example and are not to be taken to limit the scope of the appended claims.

We claim:

1. A liquid coating composition consisting essentially of:

(i) from 77.3 to 87.0 weight percent of a liquid, multifunctional, bisphenol A epoxy;

(ii) from 9.7 to 19.3 weight percent of a liquid, multifunctional, hydroxyl-containing organic material chosen from the group consisting of polyether polyols and polyester polyols;

(iii) from 1.25 to 1.70 weight percent of a complex sulfonium salt photoinitiator selected from the group consisting of sulfonium salts of formulae $Ar_3S^+X^-$, wherein Ar is aryl or aryl substituted with butoxy, chloro, phenoxy, acetoxy, thiomethoxy or acetamido and X is selected from the group consisting of $BF_4$, $PF_6$, $AsF_6$, $SbF_6$ and $CF_3SO_3$;

(iv) from 0.5 to 1.0 weight percent of a complex iodonium salt photoinitiator selected from the group consisting of iodonium salts of formulae $Ar_2I^+X^-$, wherein Ar is aryl or aryl substituted with methyl, heptyl, nitro, chloro, trifluoromethyl, phenoxy, thio, bromo, methoxy, carboxy, methoxycarbonyl or acetamido and X is selected from the group consisting of $BF_4$, $PF_6$, $AsF_6$, $SbF_6$ and $CF_3SO_3$; and (v) from 0.5 to 1.0 weight percent of a complex cupric salt initiator of formula, $Cu[II](Y^b)_a$ wherein Y is an organic or inorganic anion and the product of a times b is −2, said complex cupric salt and said complex iodonium salt generating a Brønsted acid in the presence of heat and said hydroxyl-containing organic material.

2. The composition as recited in claim 1 wherein said hydroxyl containing organic material is a polyether polyol; and said complex cupric salt initiator is selected form the group of copper benzoate and copper acetate monohydrate and is of a weight approximately equal to the weight of said iodonium salt.

3. A composition consisting essentially of the composition according to claim 1 and a dye.

4. A composition according to claim 1 wherein said liquid, multifunctional bisphenol A epoxy has the chemical structure

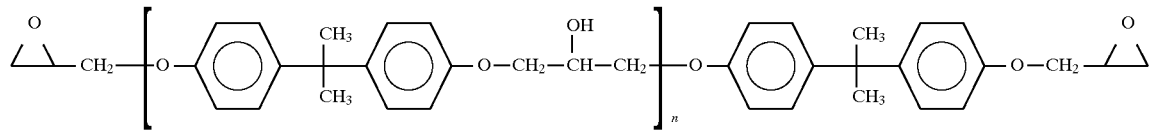

wherein n is greater than zero.

5. The liquid coating composition of claim 1 wherein $Ar_3S^+$— is triphenylsulfonium and $Ar_2I^+$— is diphenyliodonium.

* * * * *

UNITED STATES PATENT AND TRADEMARK OFFICE
CERTIFICATE OF CORRECTION

PATENT NO. : 5,773,528
DATED : Jun. 30, 1998
INVENTOR(S) : Alvarado et al.

It is certified that error appears in the above-identified patent and that said Letters Patent is hereby corrected as shown below:

| | |
|---|---|
| Column 7, Line 1 | delete "4-chlorophenyldiphenylsulfonium" and replace with --chlorophenyldiphenylsulfonium-- |
| Column 7, Line 41 | delete "Cu(II)30" and replace with --Cu(II)50-- |
| Column 10, Line 40 | delete "Noyakup" and replace with --Novakup-- |

Signed and Sealed this

Second Day of March, 1999

Attest:

Q. TODD DICKINSON

*Attesting Officer*       Acting Commissioner of Patents and Trademarks